United States Patent
Luo et al.

(10) Patent No.: US 7,391,100 B2
(45) Date of Patent: Jun. 24, 2008

(54) INTEGRATED CIRCUIT PACKAGE FOR SEMICONDUCTOR DEVICES HAVING A REDUCED LEADFRAME PAD AND AN INCREASED BONDING AREA

(75) Inventors: Leeshawn Luo, San Jose, CA (US); Anup Bhalla, Santa Clara, CA (US); Yueh-Se Ho, Sunnyvale, CA (US); Sik K. Lui, Sunnyvale, CA (US); Mike Chang, Cupertino, CA (US)

(73) Assignee: Alpha & Omega Semiconductor Limited, Hamilton (BM)

( * ) Notice: Subject to any disclaimer, the term of this patent is extended or adjusted under 35 U.S.C. 154(b) by 0 days.

(21) Appl. No.: 10/972,746

(22) Filed: Oct. 25, 2004

(65) Prior Publication Data
US 2005/0145996 A1    Jul. 7, 2005

Related U.S. Application Data

(62) Division of application No. 10/189,333, filed on Jul. 2, 2002, now Pat. No. 6,841,852.

(51) Int. Cl.
*H01L 23/48* (2006.01)
*H01L 23/495* (2006.01)
*H01L 23/50* (2006.01)
*H01L 23/485* (2006.01)
*H01L 21/02* (2006.01)

(52) U.S. Cl. ............ 257/666; 257/E23.02; 257/E23.052; 257/E23.097; 257/784; 257/786; 257/676; 257/691; 257/696; 257/698; 257/787; 257/728; 257/724

(58) Field of Classification Search ............ 257/E23.02, 257/E23.052, E23.079, 666, 784, 676, 786, 257/690–693, 696, 698, 787, 724, 728
See application file for complete search history.

(56) References Cited

U.S. PATENT DOCUMENTS

| 5,519,576 A | * | 5/1996 | Moore ........................ 361/723 |
| 5,700,975 A | * | 12/1997 | Takata et al. ................ 174/548 |
| 6,552,420 B1 | * | 4/2003 | Corisis ........................ 257/676 |
| 6,756,689 B2 | * | 6/2004 | Nam et al. ................... 257/783 |
| 2004/0053447 A1 | * | 3/2004 | Foster et al. ................ 438/123 |

FOREIGN PATENT DOCUMENTS

JP    2000-49273    *    2/2000

* cited by examiner

*Primary Examiner*—Alexander O Williams
(74) *Attorney, Agent, or Firm*—Schein & Cai LLP; Douglas E. Mackenzie

(57) ABSTRACT

A semiconductor integrated circuit package having a leadframe (108) that includes a leadframe pad (103*a*) disposed under a die (100) and a bonding metal area (101*a*) that is disposed over at least two adjacent sides of the die. The increase in the bonding metal area (101*a*) increases the number of interconnections between the metal area (101*a*) and the die (100) to reduce the electric resistance and inductance. Furthermore, the surface area of the external terminals radiating from the package's plastic body (106) is increased if not maximized so that heat can be dissipated quicker and external terminal resistances reduced. The integrated circuit is applicable for MOSFET devices and the bonding metal area (101*a*) is used for the source terminal (101). The bonding metal area may have a "L" shape, a "C" shape, a "J" shape, an "I" shape or any combination thereof.

2 Claims, 10 Drawing Sheets

INTEGRATED CIRCUIT PACKAGE FOR SEMICONDUCTOR DEVICES HAVING A REDUCED LEADFRAME PAD AND AN INCREASED BONDING AREA

CROSS REFERENCE TO RELATED APPLICATIONS

This is a divisional application of Ser. No. 10/189,333, filed on Jul. 2, 2002, now U.S. Pat. No. 6,841,852.

FIELD OF INVENTION

The present invention is directed to integrated circuit packaging, and more particularly to an integrated circuit (IC) package for power semiconductor devices, such as metal-oxide semiconductor field-effect transistor (MOSFET) devices, that reduces the package electrical resistance, inductance and thermal resistance to enable the device be more efficient and dissipate more power.

BACKGROUND OF THE INVENTION

Today's advanced silicon technology allows for very low on-resistance power MOSFETs, enabling the use of small chips operating at very high power densities. In many cases, package resistance can be equal to the Silicon resistance— this is a very uneconomical use of the device Silicon. There is constant thrust to lower cost by decreasing package resistance. Due to the higher power densities, there is a need to have packages with lower thermal resistance. Package parasitic inductance can contribute to a majority of the power dissipated in the MOSFET in high frequency switching applications as in switch-mode power supplies. This problem becomes more severe as lower device resistances and improved technology allow for higher operating currents for the same package size.

With reference to FIG. 1, a top view of a conventional semiconductor package 1 having a leadframe 8 and die 10 molded in a plastic body 16 is illustrated. In this exemplary prior art embodiment, the die 10 embodies a MOSFET device and the leadframe 8 includes a source terminal 11, a gate terminal 12 and a drain terminal 13. Source terminal 11 of the leadframe 8 includes a plurality of separate source leadframe fingers or leads 11b external to the plastic body 16 and a plurality of separate internal source bonding areas 11a where the bond wires 14 are bonded. The drain terminal 13 includes a plurality of separate drain leadframe fingers or leads 13b which are connected to the leadframe pad 13a. The gate terminal 12 includes an external gate lead 12b connected to an internal gate bonding area 12a, the bonding area 12a is connected to a gate pad 17 via wire 15.

FIG. 2 illustrates a top view of another conventional semiconductor package 19. In this embodiment, in lieu of a plurality of separate source bonding area 11a as shown in FIG. 1, the source bonding area 21a of the source terminal 21 is joined to form a single source bonding area 21a for bonding wires 24 to die 20. As with the embodiment of FIG. 1, the separate source leadframe fingers or leads 21b and the separate leadframe drain fingers or leads 23b of drain 23 are separate narrow metal strips that radiate externally from the plastic body 26 and are adapted to be inserted into the same receptacle location on a PC board as the device embodied in FIG. 1.

Similar to the embodiment of FIG. 1, the leadframe pad 23a has die 20 disposed thereon and provides a generally narrow border frame around the perimeter of die 20. Moreover, the bonding area 22a of gate 22 is coupled via wire 25 to gate pad 27 formed at the nearest corner. In the prior art embodiments, the source and gate bonding areas 11a, 21a and 12a, 22a share the same left side of the die 10, 20. Likewise, the source leads 21b and the gate lead 22b radiate from the same left side.

Referring now a FIG. 3, a top view of a conventional dual-die semiconductor package 29 is shown. The dual-die semiconductor package 29 having a plastic body 36 that includes a first die 30 disposed over a first leadframe pad 33a and a second die 40 disposed over a second leadframe pad 43a. The first source terminal 31 includes at least one source leadframe lead 31b and a source bonding area 31a distributed along the left side of the first die 30. The source bonding area 31a is interconnected to the first die 30 via bond wires 34. The first gate terminal 32 has a gate bonding area 32a that shares the left side of the first die 30 and a gate leadframe lead 32b. The gate bonding area 32a is connected to the gate pad via bond wire 35. The first drain terminal 33 includes a plurality of separate drain leadframe leads 33b that are coupled to the first leadframe pad 33a.

Similar to the first die 30, the second source terminal 41 includes at least one source leadframe lead 41b and a source bonding area 41a distributed along the left side of the second die 40. The source bonding area 41a is coupled to die 40 via bond wires 44. The second gate terminal 42 has a gate bonding area 42a that shares the left side of the second die 40 and a gate leadframe lead 42b. Bond wire 45 is used for interconnection. The second drain terminal 43 includes a plurality of separate drain leadframe leads 43b that are coupled to the second leadframe pad 43a.

As explained before there is a need to reduce package electric resistance, inductance and enhance power dissipation for a metal-oxide semiconductor (MOSFET) device that is able to carry high electric current loading with a new leadframe and package design.

We have determined that by utilizing some of the real estate in the package's plastic body, by decreasing the size of the die and the leadframe pad, to increase the bonding area in order to increase the interconnections between the source terminal and the die, the electric resistance and inductance of the package can be reduced. The reduction in resistance comes from having more wires in parallel, while the improvement inductance comes from not only having more wires in parallel, but from spreading them further part, thereby reducing the mutual coupling inductance between wires.

Furthermore, increasing the surface area of the external source and drain leads, exposed to air, reduces external terminal resistance and allows heat to be dissipated quicker.

As will be seen more fully below, the present invention is substantially different in structure, methodology and approach from that of prior IC packages and leadframe designs.

SUMMARY

The preferred embodiment of the integrated circuit package of the present invention solves the aforementioned problems in a straight forward and simple manner.

Broadly, the present invention contemplates a method of improving the package by giving up some of the real estate reserved for the silicon or die to redistribute a bonding area, such as for the source or other heavy current loaded terminal, about corners and adjacent sides of the die so as to increase the interconnections between such bonding area and the top conductive surface of the die in order to reduce the electrical resistance and inductance.

The present invention contemplates an "L"-shaped bonding area, a "C"-shaped bonding area, a "J"-shaped bonding area and/or an I shaped bonding area or any combination thereof depending on the number of die or dice integrated in the package.

Furthermore, the present invention contemplates a method of increasing the surface area of the source and drain terminal areas that are external to the body to dissipate heat quicker and reduce the external terminal resistances. In other words, the area of the leadframe metallization is increased to improve the thermal resistance of the package. This includes fusing all or some of the leads of a terminal, either completely or partially.

The above and other objects of the present invention will become apparent from the drawings, the description given herein, and the appended claims.

BRIEF DESCRIPTION OF THE DRAWINGS

A more complete understanding of the present invention may be obtained from consideration of the following description in conjunction with the accompanying drawings in which like parts are given like reference numerals and, wherein.

DETAILED DESCRIPTION OF THE INVENTION

Figure 4:
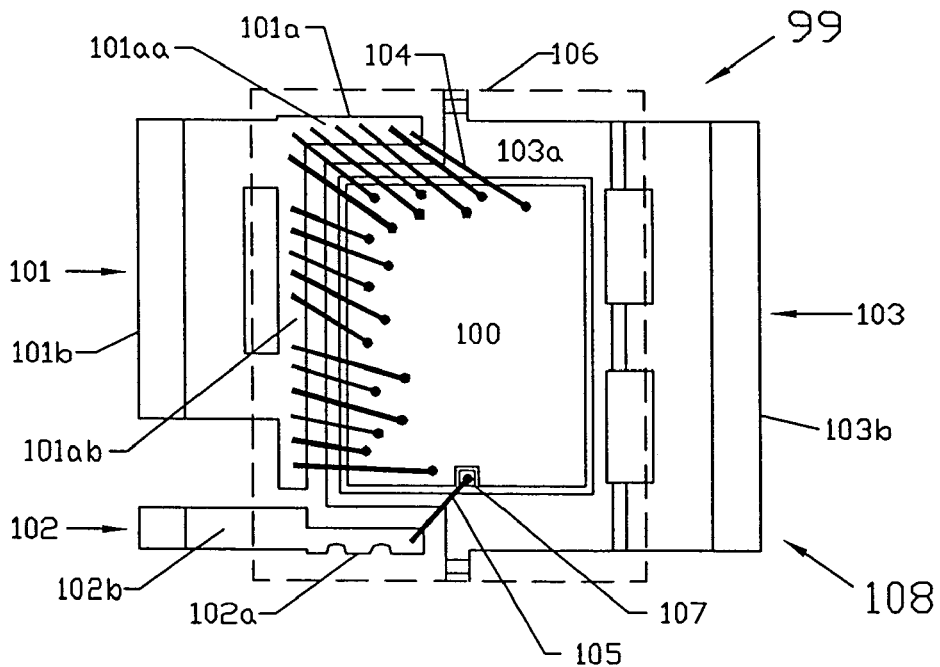
FIG. 4 illustrates a top view of the semiconductor package constructed in accordance with a first embodiment of present invention.

Referring now to the drawings and more particularly to FIG. 4, the semiconductor integrated circuit (IC) package of the present invention will be referenced by the numeral 99. The semiconductor integrated circuit (IC) package 99 includes, in general, a semiconductor die 100 disposed over a leadframe pad 103a both of which are molded in a plastic body 106. The package 99 further includes the necessary interconnections well known in the art for coupling the die 100 to the leadframe pad 103a and/or leadframe 108, some of which are described in detail below.

As will be seen based on the description provided below, the objectives of the present invention can be related to a variety of semiconductor devices. Accordingly, to describe each and every device application is prohibitive. For exemplary purposes, FIG. 4 illustrates a top view of the semiconductor IC package 99 for a MOSFET device having three terminals (e.g. a source terminal 101, a gate terminal 102 and a drain terminal 103) integrated into the leadframe 108.

The semiconductor interconnection will now be described below. However, it is important to note that the objectives of the present invention have been accomplished by reducing the size of the die 100 and the leadframe pad 103a about at least a portion of a top side of the die 100 and increased the size of the metal bonding area 101a of the source terminal 101 about such corner.

Figure 1:
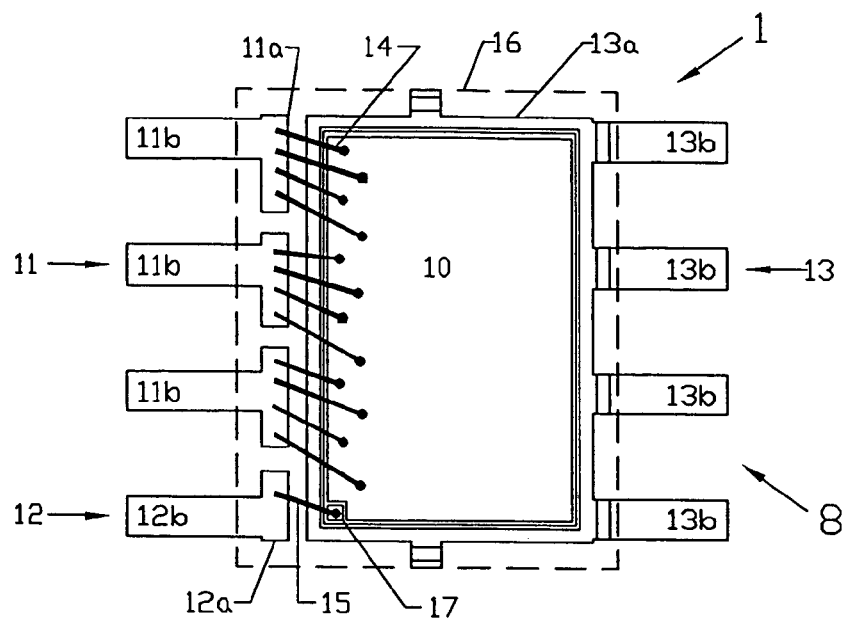
FIG. 1 illustrates a top view of a first embodiment of a conventional semiconductor package.
Figure 2:
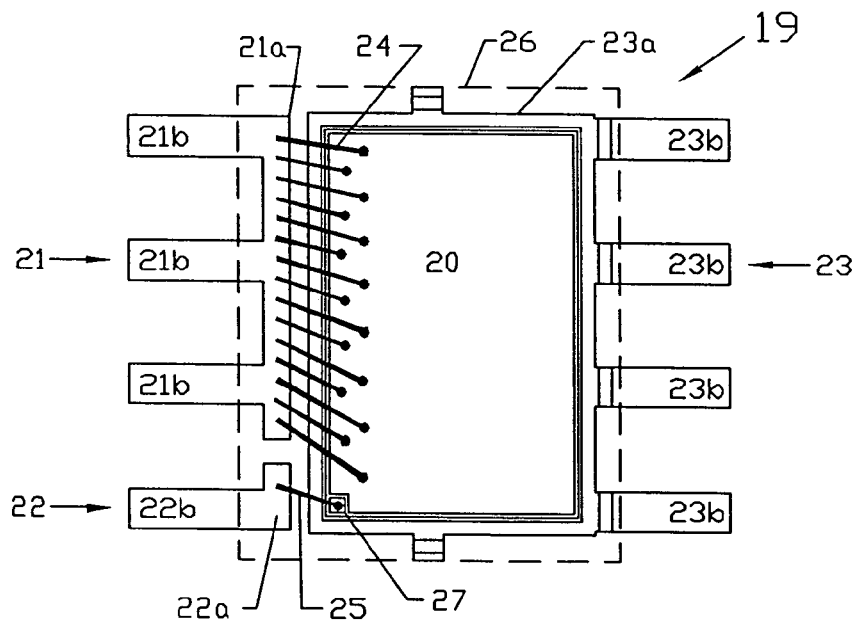
FIG. 2 illustrates a top view of a second embodiment of a conventional semiconductor package.

The "L"-shaped footprint of the source's metal bonding area 101a increases the source's bonding area over the prior art. In the exemplary embodiment, the portion of the length of the top side is approximately half the length. However, as will be seen in other embodiments below the length may be substantially the entire length of the top side of the package. Nevertheless, such increase on the source's bonding area 101a provides for an increase in the number of source bond wires 104 interconnecting the source terminal 101 with the die 100. Furthermore, the distance between bonding wires 104 is not compromised to increase the number of wire 104. Instead, the distance is increased to improve inductance. For example, it is estimated that the number of source bond wires 104 could be increased 30% to 40% as compared to conventional leadframe designs, as shown in FIGS. 1 and 2. The increase in the source bond wires 104 that are bonded on top of the die's conductive surface provides a lower bond loop for interconnection. Thus, the package's resistance and inductance is lowered.

Figure 7:
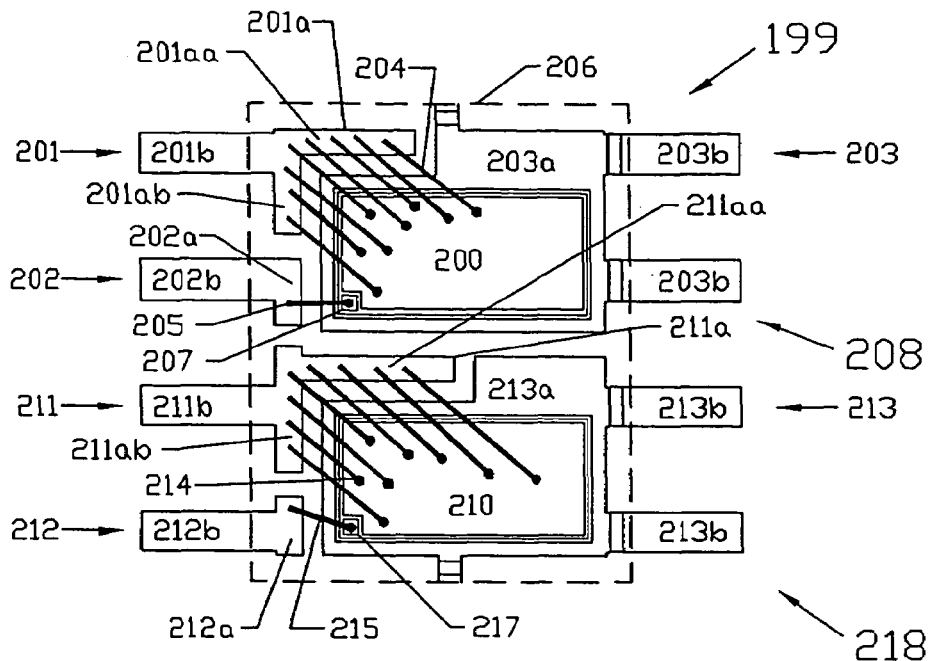

It should be noted that the "L"-shaped footprint is shown inverted approximately 180 degrees since the first leg 101aa is shorter than the second leg 101ab in this embodiment. However, in other embodiments or designs where the first leg 101aa is longer a different configuration is achieved. For example, as shown in FIG. 7, the "L"-shaped footprint represents a "L"-shape that is rotated approximately 90 degrees since the second leg 201ab appears shorter than the first leg 201aa.

In the embodiment of FIG. 4, the increase in the number of bond wires 104 was accomplished by removing a portion of the leadframe pad 103b along a bottom side of the reduced die 100. Since the gate of the MOSFET device handles a relatively small current, in general, one wire 105 is sufficient for interconnection between die 100 and the gate's terminal 102. The gate's bonding area 102a of the gate terminal 102 is extended along a portion of the bottom side of the die 100 or leadframe pad 103a. In the exemplary embodiment, the gate's bonding area 102a extends slightly less than half the length of the bottom side of package 99. The gate pad 107 is provided substantially in the center of die 100 along its bottom side. The distributing the gate's bonding area 102a along a portion of the length of the bottom side of the die 100 provides a direct path for connection of the bond wire 105. The gate's lead 102b projects from the left side of body 106.

The shift of the gate pad 107, away from the bottom left corner, frees up the left side including its corresponding bottom left corner so that source bond wires 104 can be substantially evenly bonded along the left side, including down to the bottom left corner of die 100. Furthermore, the "L"-shaped bonding area 101a for the source terminal 101 allows source bond wires 104 bonded to the first leg 101aa to be interconnected to the top side of the die 100 and distributed in close proximity to the top right corner of the die 100.

The die 100 is attached onto the leadframe pad 103a, which is part of the drain's metal terminal 103, inside the plastic body 106 using a conductive silver (Ag) epoxy. Within the plastic body 106, the leadframe pad 103a extends into those areas of the body's real estate along the top and bottom sides of the die 100 that are adjacent to the first leg 101aa of the source's bonding area 101a and the gate's bonding area 102a. Therefore, the area of the leadframe pad 103a to which the drain's external leadframe section 103b is fused or integrated on the right side of the die 100 is not generally decreased.

In the exemplary embodiment, the footprint of the leadframe pad 103a is not limited to the general shape of the die 100 such that it creates a narrow-width border therearound. The perimeter of the die 100 with respect to the borders of the plastic body 106 has been reduced to provide the necessary free space for the placement of the first leg 101aa of the source's "L"-shaped bonding area 101a and the gate's bonding area 102a. Accordingly, reference to "L"-shape is defined to include both embodiments.

Both the source's external leadframe terminal section 101b and the drain's external leadframe terminal section 103b external to the plastic body 106 are essentially continuous and substantially solid and do not have individual leadframe fingers or leads that are common in the prior art, such as shown in FIGS. 1 and 2. More specifically, the enlarged surface area of the source and drain leadframe terminal sections 101b and 103b increases the surface area exposed to air, such surface area is almost 2 times (twice) that of a conventional package with individual leadframe fingers or lead 11b and 13b, as shown in FIG. 1. Therefore, the enlarged external leadframe terminal sections 101b and 103b will dissipate heat faster, especially, heat that is generated during current loading. Moreover, while not wishing to be bound by theory, the enlarged source and drain leadframe terminal sections 101b and 103b will reduce package thermal resistance.

In the preferred embodiment, the external surface areas of the source terminal 101 and the drain terminal 103 are increased. In the embodiment of FIG. 4, the external surface areas of the source terminal 101 and the drain terminal 103 are maximized by providing a single, solid external leadframe terminal for each along the left and right sides of the plastic body 106. However, PC boards (NOT SHOWN) are conventionally designed with holes that match the pattern and number of leadframe fingers or leads so that the package is surface mounted. Thus, the PC board (NOT SHOWN) would require modification to accommodate the design of the source, gate and drain terminals 101, 102 and 103 of the present invention.

Figure 5:
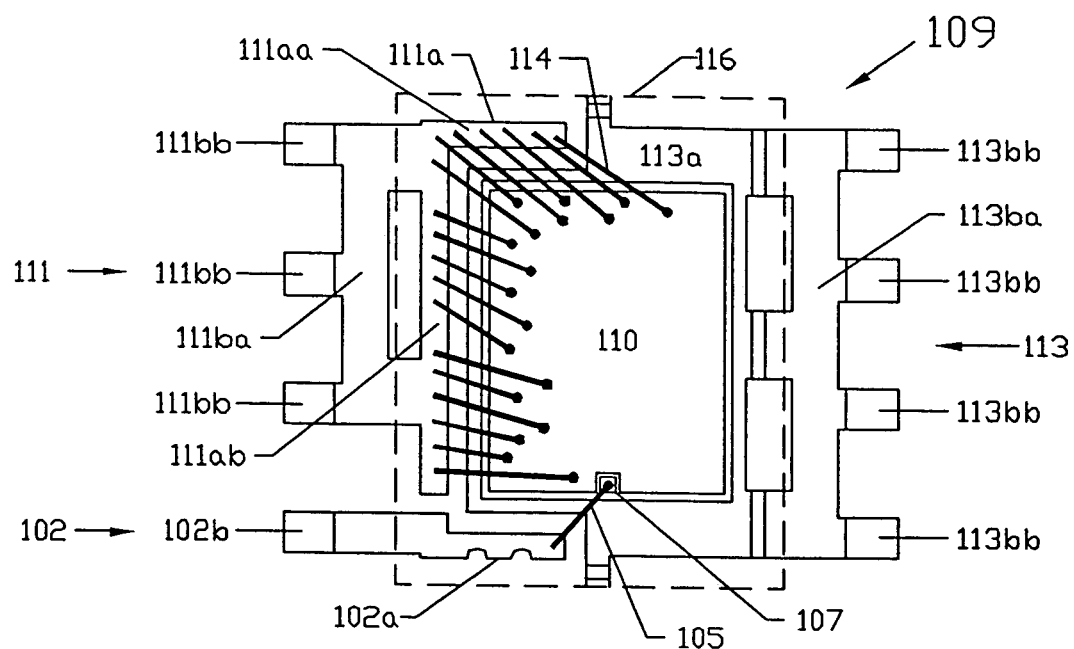
FIG. 5 illustrates a top view of the semiconductor package constructed in accordance with a second embodiment of present invention.

With reference to FIG. 5, another IC package 109 is shown. Since the embodiment of FIG. 5 is similar to the embodiments of FIG. 4 only the differences will be described in detail. In order to eliminate the need to modify the PC board connections, spaced-apart leadframe feet 111bb and 113bb are added to the bottom portion of the source's terminal 111 and the drain's terminal 113, respectively. However, the upper portion of the source's terminal 111 and the drain's terminal 113 remains continuous and essentially solid such that a single metal strip 111ba for the source's terminal 111 radiates from the left side of the plastic body 116 and a single metal strip 113ba for the drain's terminal 113 radiates from the right side of the plastic body 106. The source's terminal 111 includes an "L"-shaped metal bonding area 111a having legs 111aa and 111ab fused to the single metal strip 111ba and bonded to die 110 via bond wires 114.

Figure 6:
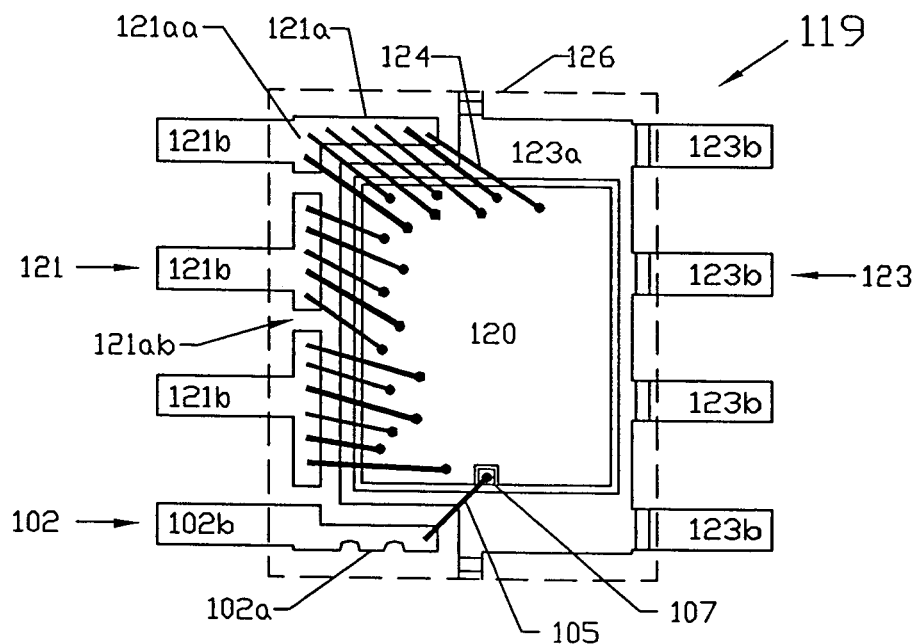
FIG. 6 illustrates a top view of the semiconductor package constructed in accordance with a third embodiment of present invention; and, FIG. 7 illustrates a top view of the semiconductor package design with dual pad for a dual-die design in accordance with a fourth embodiment of present invention.

Another embodiment of the present invention is shown in FIG. 6. Since the embodiment of FIG. 6 is similar to the embodiments of FIG. 4 and FIG. 5 only the differences will be described in detail. The embodiment of FIG. 6 illustrates an IC package 119 that has a discontinuous "L"-shape bonding area 121a. More specifically, the second leg of the "L"-shaped bonding area 121a is comprised of a plurality of spaced apart metal sections that is distributed along substantially the entire length of the left side of the die 120. However, the first leg 121aa is shown as continuous and is fused or integrated with a top section of the discontinuous second leg 121a.

Furthermore, in this embodiment, the source and drain external terminal sections include spaced-apart leadframe fingers or leads 121b and 123b of source and drain terminals 121 and 123, respectively. Each metal section of the discontinuous second leg 121ab has associated therewith a respective leadframe finger or lead 121b that is external to the plastic body 126. The die 120 is disposed over the leadframe pad 123a.

Each of the metal sections of the discontinuous second leg 121ab is interconnected with die 120 via the bond wires 124. Although, the embodiment of FIG. 6 provides a discontinuous "L"-shaped bonding area 121a, the surface area of the boding area 121a is sufficiently increased over the bonding area of prior art FIG. 3.

Referring now to FIG. 7, a dual-die IC package 199 is shown. For exemplary purposes, FIG. 7 illustrates a top view of the dual-die IC package 199 for two MOSFET devices each having three terminals (e.g. source terminals 201, 211, gate terminals 202, 212 and drain terminals 203, 213) provided by the leadframes 208 and 218. The first source terminal 201 has an external leadframe terminal section 201b and a first "L"-shaped metal bonding area 201a integrated with section 201b. The first source's metal bonding area 201a has a generally "L"-shaped footprint that includes a first leg 201aa that borders a portion of the top side (first side) of the first die 200 and the first leadframe pad 203a and a second leg 201ab that extends along a portion of the left side (second side) of the first die 200 or the leadframe pad 203a. The wires 204 are evenly bonded along the top side of the first die 200 and along the left side.

In this embodiment, the gate's bonding area 202a of the first die 200 shares the left side with the second leg 201ab. Furthermore, the bond wire 205 is sufficient for interconnection between the first die 200 and the gate's terminal 202. In this embodiment, the gate pad 207 is provided in the bottom left corner of the first die 200. The gate leads 202b and 212b shares the same left side of body 206.

The second source terminal 211 has an external leadframe terminal section 211b and a second "L"-shaped metal bonding area 211a integrated with section 211b. The second source's metal bonding area 211a has a generally "L"-shaped footprint that includes a first leg 211aa that borders a portion of the top side (first side) of the second die 210 and the second leadframe pad 213a and a second leg 211ab that extends along a portion of the left side (second side) of the second die 210 or the leadframe pad 213a. The wires 214 are evenly bonded along the top side of the second die 210 and along the left side.

Similar to the gate's bonding area 202a of the first die 200, the gate's bonding area 212a shares the left side with the second leg 211ab. Furthermore, a single bond wire 215 is sufficient for interconnection between the second die 210 and the gate's terminal 212. The gate pad 217 is provided in the bottom left corner.

Figure 3:
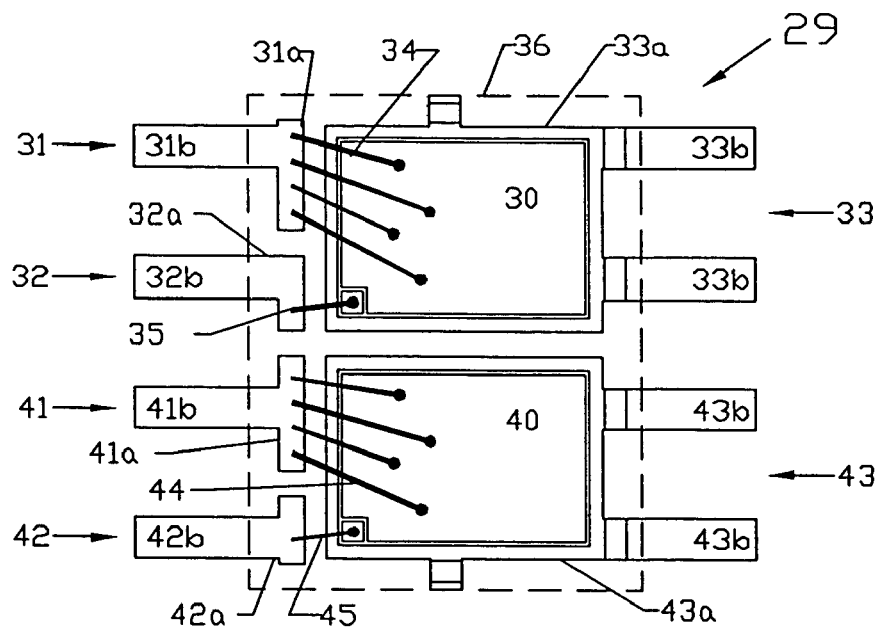
FIG. 3 illustrates a top view of a third embodiment of a conventional semiconductor package for a dual-die design.

In the exemplary embodiment, the source's bonding areas 201a and 211a have been increased more than 2 times (twice) that of the prior art design such as shown in FIG. 3. While not wishing to be bound by theory, the present embodiment reduces not only the resistance of the source interconnection wires 204 and 214 and the surface spreading resistance of dice 200 and 210, but also reduces electric inductance.

The first die 200 is attached onto leadframe or copper (Cu) pad 203a that has a plurality of external spaced-apart drain leads 203b contacted to and extending outside the plastic body 206. Likewise, the second die 210 is attached onto leadframe or Cu pad 213a that has a plurality of spaced-apart external drain leads 213b contacted to and extending outside the plastic body 206.

Figure 8:
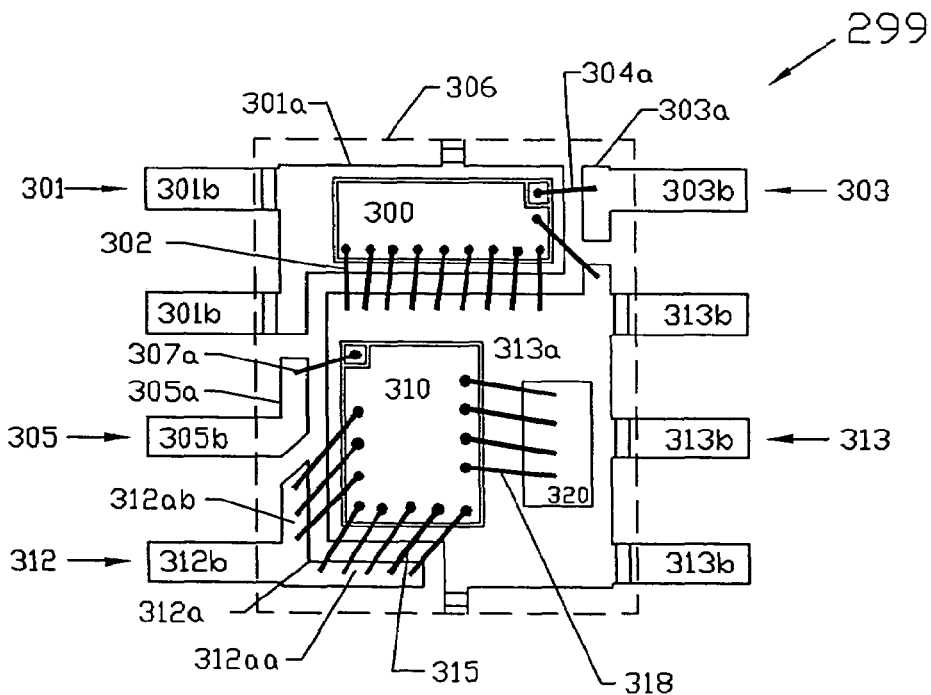
FIG. 8 illustrates a top view of the semiconductor package design with dual pad for a multiple-die design in accordance with a fifth embodiment of present invention.

Referring now to FIG. 8, an alternate embodiment of a dual-die semiconductor package 299 is shown. For exemplary purposes, FIG. 8 illustrates a top view of dual-die semiconductor package 299 having two MOSFET devices. The die 310 has three terminals (e.g. source terminal 312, gate terminal 305 and drain terminal 313. The die 300 has a gate terminal 303 and a drain terminal 301. The source of the die 300 is connected to the leadframe pad 313a of the second die 310 via bond wires 302. The dual-die semiconductor package 299 further includes electrical component 320 wherein the electrical component may be another die, a resistor, capacitor, etc. In the embodiment shown, the electrical component 320 is a die of an integrated circuit that is coupled to the die 310 via bond wires 318.

The source terminal 312 of die 310 has an external leadframe terminal section or lead 312b and a "L"-shaped metal bonding area 312a integrated with section or lead 312b. The source's metal bonding area 312a has a generally "L"-shaped footprint that includes a first leg 312aa that borders a portion of the bottom side (first side) of the die 310 and the second leadframe pad 313a and a second leg 312ab that extends along a portion of the left side (second side) of the die 310 or the leadframe pad 313a. The bonding wires 315 are substantially evenly bonded along the bottom side and left side of the die 310.

In the exemplary embodiment, the bond wires 302 are evenly coupled to the top of die 300 and to the leadframe pad 313a.

In this embodiment, the gate's bonding area 303a of the first die 300 is bonded via bond wire 304a to the gate pad in a top right corner of die 300. The gate's bonding area 305a of the second die 310 is bonded via bond wire 307a to the gate pad in a top left corner of die 310.

The drain terminal 301 of die 300 includes leadframe pad 301a having drain leads 301b coupled there to. The drain terminal 313 of die 310 includes drain leads 313b. As can be seen, the drain terminal 301 and 313 are on opposite side of the package 299. Furthermore, the gate terminals 303 and 305 and gate leads 303b and 305b, respectively, are on opposite side of the package 299.

Figure 9:
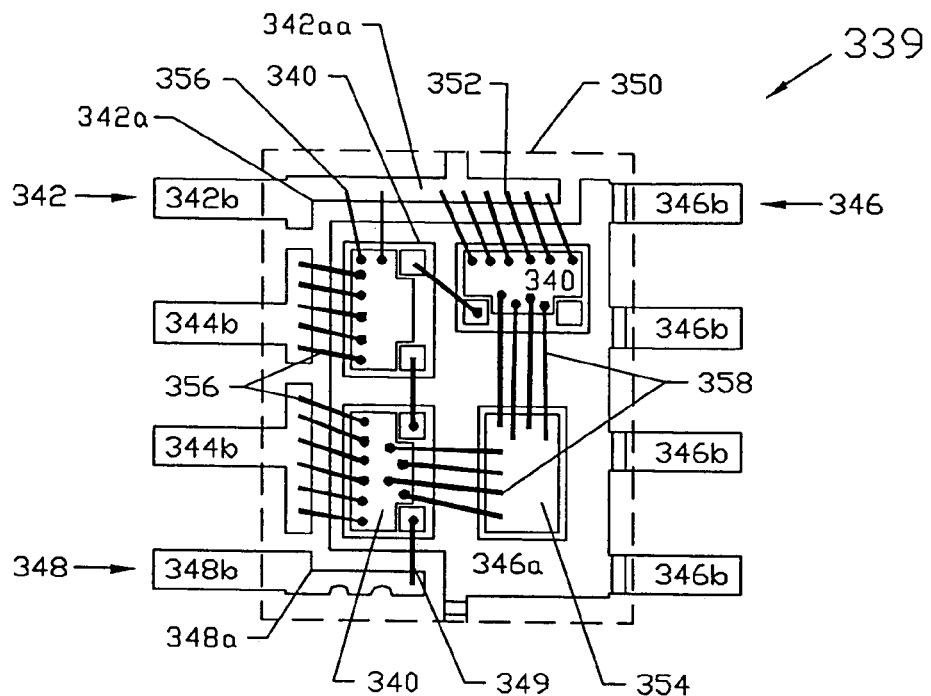
FIG. 9 illustrates a top view of the semiconductor package design with single pad for a multiple-die design in accordance with a sixth embodiment of present invention.

Referring now to FIG. 9, a still further embodiment of a multi-die semiconductor package 339 is shown. In this embodiment, there are three dice 340 having a MOSFET device and a die 354 of an integrated circuit. The three dice 340 and die 354 share the same leadframe pad 346a. Furthermore, the source terminal 342 comprises a discontinuous "L"-shape bonding area 342a. More specifically, the second leg of the "L"-shaped bonding area 342a is comprised of a first leg 342aa that extends substantially along the length of the top side of body 350 so that at least two of the dice 340 can share such first leg 342aa to connect bond wires 352 and 356 to their respective dice 340.

Additionally, the second leg 342ab of the "L"-shape bonding area 342a has a plurality of spaced apart metal sections that is distributed along substantially the entire length of the left side of the body 350. The each section of the plurality of spaced apart metal sections of second leg 342ab has a source lead 342b coupled thereto.

Furthermore, in this embodiment, the drain terminal 346 has a plurality of leadframe fingers or leads 346b coupled to leadframe pad 346a and radiate from the right side of body 350.

The gate terminal 348 and its lead 348b is shared by the dice 340. The gate's bonding area 348a is interconnected to a gate pad in one of the dice 340 via bond wire 349. In this embodiment, each die 340 has two gate pads used to interconnect the gate terminals of the dice 340 together via bond wires 351. The die 354 is connected to the top of the die 34 to its left and above via bond wires 358.

As can be appreciated, the embodiment of FIG. 9 provides a "L"-shaped bonding area that extends substantially along the top length of the body 350 and the left side wherein such area is shared by multiple dice. Therefore, a higher density package is generated without compromising the on-resistance and inductance parameters.

Figure 10:
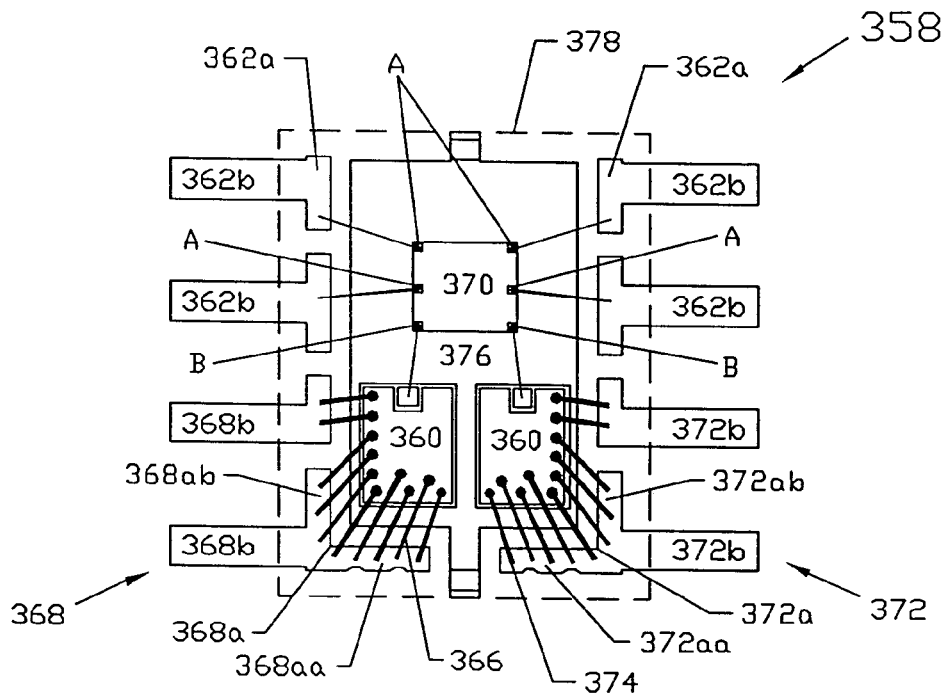
FIG. 10 illustrates a top view of the semiconductor package design with single pad for a multiple-die design in accordance with a seventh embodiment of present invention.

Referring now to FIG. 10, a still further alternate embodiment of a multi-die semiconductor package 358 is shown. In this embodiment, the package has two side-by-side MOSFET devices 360 having "L"-shaped source terminals 368 and 372.

The source terminal 368 has an external leadframe terminal section 368b and a "L"-shaped metal bonding area 368a integrated with section 368b. The "L"-shaped metal bonding area 368a is coupled to die 360 via bond wires 366. The source terminal 372 has an external leadframe terminal section 372b and a "L"-shaped metal bonding area 372a integrated with section 372b. Each "L"-shaped metal bonding area 368a and 372a are disposed at opposite corners of the body 378. In the exemplary embodiment, they are disposed at the bottom corners. Furthermore, the second legs 368ab of the "L"-shape bonding area 368a has a plurality of spaced apart metal sections that is distributed along substantially the entire length of the left side of the body 378. The each section of the plurality of spaced apart metal sections of second leg 368ab has a source lead 368b coupled thereto. Likewise, each section of the plurality of spaced apart metal section of second leg 372*ab* has a source lead 372*b* coupled thereto. The "L"-shape bonding area 372*a* is coupled to its die 360 via bond wires 374.

In this embodiment, the source leads 368*b* of a first die 360 are on opposite side of body 378 as the source leads 372*b* of the second die 360. The dice 360 are disposed over leadframe pad 376. Leadframe pad 376 also includes die 370 of another integrated circuit having a plurality of terminals A and a pair of terminals B. The B terminals are coupled to the gate pads of dice 360. The A terminals are coupled to leads 362 distributed on opposite sides of the package 358. Leads 362*b* are coupled to bonding areas 362*a* having bond wires connected to a respective one of the A terminals.

Figure 11:
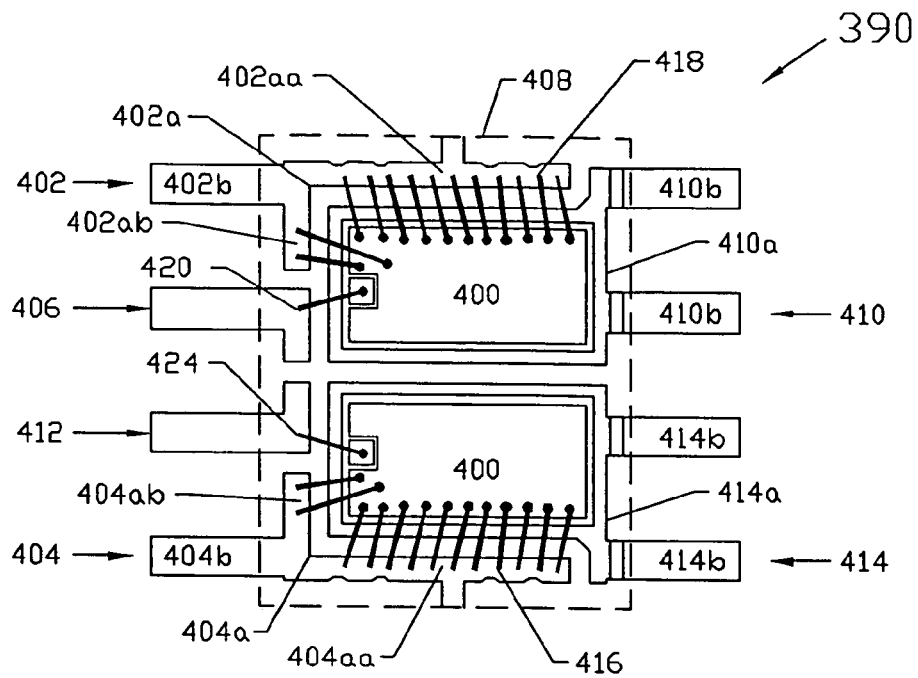
FIG. 11 illustrates a top view of the semiconductor package design with dual pad for a dual-die design in accordance with an eighth embodiment of present invention.

Referring now to FIG. 11, a still further alternate embodiment of a dual-die semiconductor package 390 is illustrated. The package 390 includes two dice 400, a first one on leadframe pad 410*a* and the other on leadframe pad 414*a*. Leadframe pad 410*a* has a plurality of drain leads 414*b*; and leadframe pad 414*a* has a plurality of drain leads 414*b*. The source terminals 402 and 404 have "L"-shaped metal bonding areas 402*a* and 404*a*, respectively. The "L"-shaped metal bonding areas 402*a* is disposed at the top left corner of the body 408 while the "L"-shaped metal bonding areas 404*a* is disposed at the bottom left corner of body 408. Area 402*a* is coupled to the top die 400 via bond wires 418; and, area 404*a* is coupled to the bottom die 400 via bond wires 416.

In the embodiment, the leg 402*aa* extends along substantially the length of the top side of the first die 400; and the leg 404*aa* extends along substantially the length of the bottom side of the second die 400.

Gates 406 and 412 have gate leads coupled to gate pads via bond wires 420 and 424, respectively. The gate pads are substantially in a center of one side of dice 400. The gate leads are coupled between the source leads 402*b* and 404*b* of source terminals 402 and 404, respectively.

In this embodiment, the left side of each dice 400 is shorter in length and the top and bottom sides of dice 400. Accordingly, "L"-shaped bonding areas 402*a* and 404*a* have second legs 402*ab* and 404*ab* which extend along the left side of their respective dice.

Figure 12:
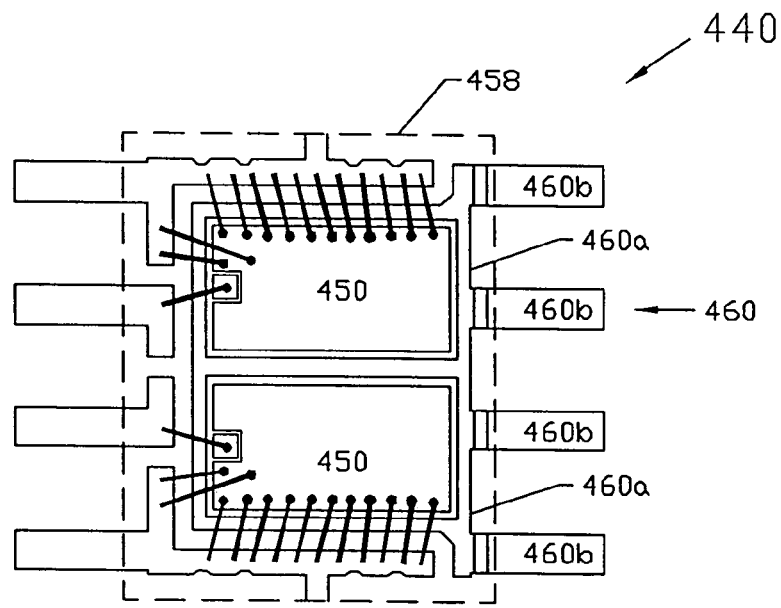
FIG. 12 illustrates a top view of the semiconductor package design with single pad for a dual-die design in accordance with a ninth embodiment of present invention.

Referring now to FIG. 12, the embodiment of FIG. 12 differs from FIG. 11 in that the dice 450 share the same leadframe pad 460*a*. Accordingly, the drain lead terminals 460*b* of the drain terminal 460 are distributed along one side of body 458 of package 440.

Figure 13:
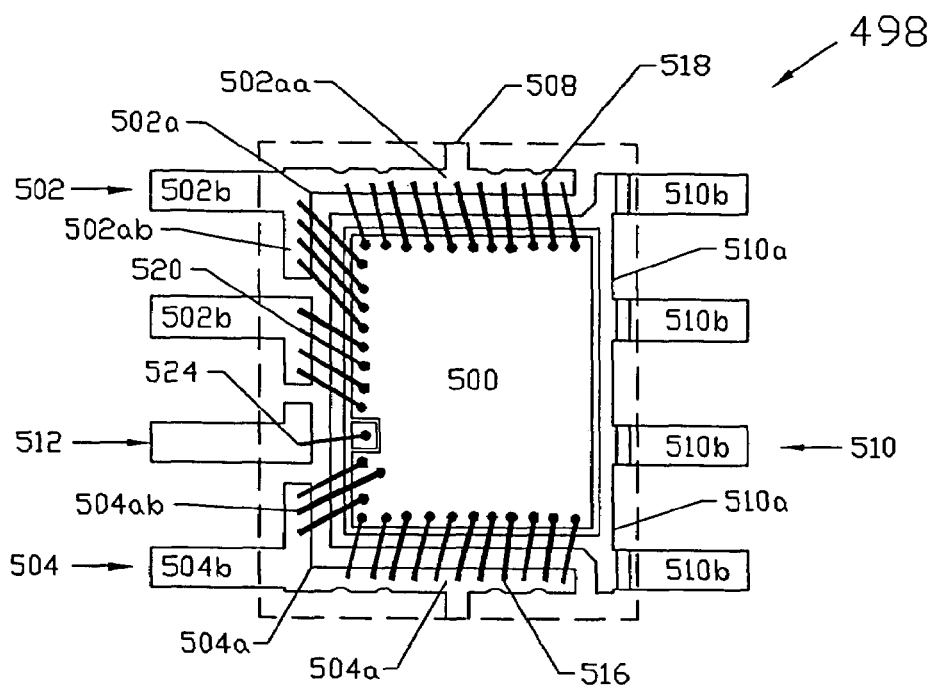
FIG. 13 illustrates a top view of the semiconductor package design with single pad for a single-die design in accordance with a tenth embodiment of present invention.

Referring now to FIG. 13, FIG. 13 is a single die package 498. The package 498 includes die 500 distributed over leadframe pad 510*a* having a plurality of drain leads 510*b* to form drain 510. The die 500 has a source terminal that comprises two "L"-shaped metal bonding areas 502*a* and 504*a*, respectively. The "L"-shaped metal bonding areas 502*a* is disposed at the top left corner of the body 508 while the "L"-shaped metal bonding areas 404*a* is disposed at the bottom left corner. The second leg 502*ab* has a plurality of metal sections. The first leg 502*aa* of the "L"-shaped metal bonding area 502*a* and the second leg 502*ab* are coupled to the top of die 500 via bond wires 518 along the top and left side of such die. The first leg 504*aa* of the "L"-shaped metal bonding area 504*a* and the second leg 504*ab* are coupled to the top of die 500 via bond wires 516 along the bottom and left side of such die.

Figure 14:
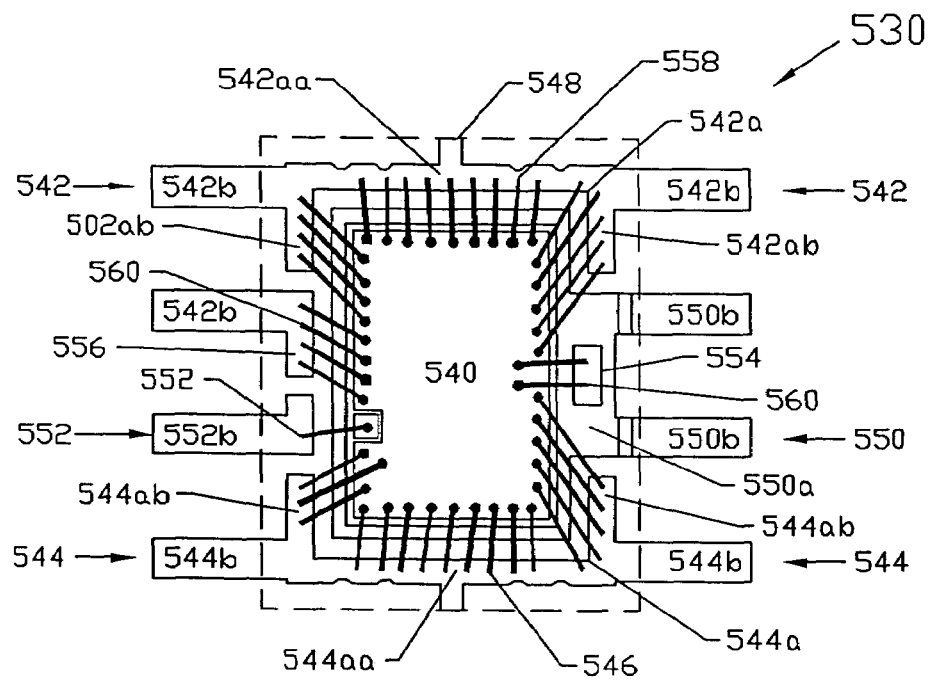
FIG. 14 illustrates a top view of the semiconductor package design with single pad for a dual-die design in accordance with an eleventh embodiment of present invention.

Referring now to FIG. 14, the package 530 of FIG. 14 differs from FIG. 13 in that the source terminal 542, 544 includes a top "J"-shaped and a bottom "C"-shaped metal bonding areas 542*a* and 544*a*, respectively. The "J"-shaped metal bonding area 542*a* includes a top "C"-shaped metal bonding area having diametrically opposing leads 542*b* radiating from opposite side of body 548. The "C"-shaped metal bonding area 542*a* includes a single continuous top area 542*aa* and two end side areas 542*ab* which are perpendicularly integrated at opposite side of the continuous area 542*aa*. The side areas 542*ab* are disposed on left and right sides respectively. The "J"-shaped metal bonding area 542*a* further includes a metal bonding area 556 that extends along the left side of body 548. Metal bonding area 556 has a source lead 542*b* coupled thereto. The "J"-shaped metal bonding area 542*a* is coupled to the top of die 540 via bond wires 558 which are distributed evenly about the top side and the top portion of the right and left sides.

The "C"-shaped metal bonding area 544*a* includes a single continuous bottom area 544*aa* and two end side areas 544*ab* which are perpendicularly integrated at opposite side of the continuous area 544*aa*. The side areas 544*ab* are diametrically opposing about the left and right sides of body 548. The "C"-shaped metal bonding area 544*a* is coupled to the bottom of die 540 via bond wires 546 which are distributed evenly about the bottom side and the bottom portion of the right and left sides.

The package 530 further includes an electrical component 554, such as, a semiconductor die, capacitor, resistor, etc. disposed on leadframe pad 550*a*. In this embodiment, the die of electrical component 554 is coupled to the top surface of die 540 via bond wires 560.

The drain terminal 550 includes a plurality of drain leads 550*b* positioned between the top source lead 542*b* and the bottom source lead 544*b*, on the right side of body 548. The gate terminal 552, and more specifically, the gate's lead 552*b* are disposed on the left side of body 548 between the "J"-shaped metal bonding area 542*a* and the "C"-shaped metal bonding area 544*a*. The gate's bonding area 552*a* is coupled to a gate pad via bond wire 557.

Figure 15:
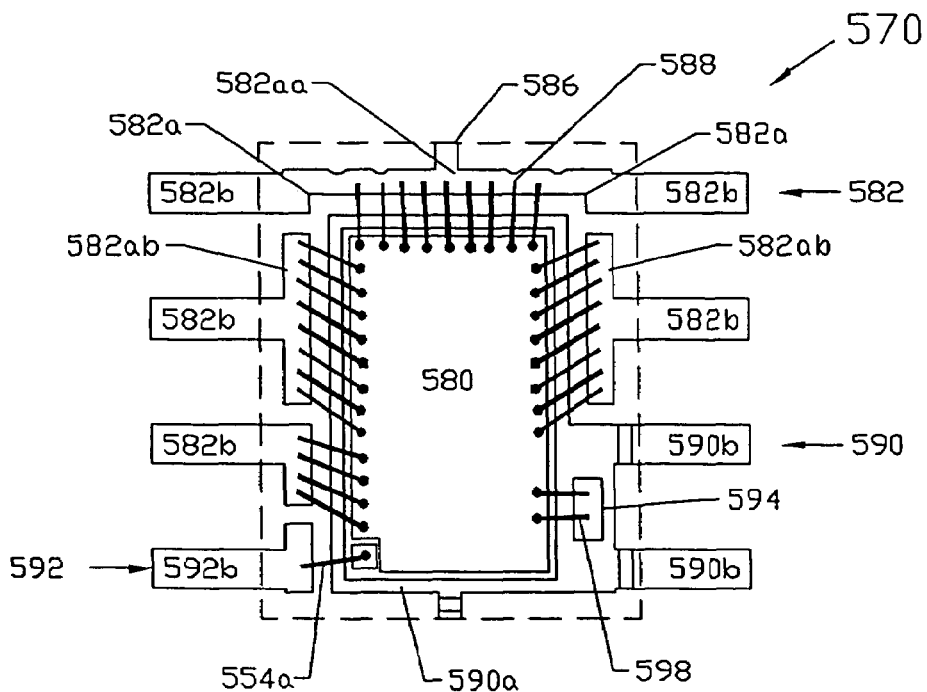
FIG. 15 illustrates a top view of the semiconductor package design with single pad for a dual-die design in accordance with a twelfth embodiment of present invention.

Referring now to FIG. 15, package 570 includes a source terminal 582 that is comprised of a single "J"-shaped metal bonding area 582*a*. The "J"-shaped metal bonding area 582*a* includes a top "C"-shaped metal bonding area having two pairs of diametrically opposing leads 582*b* radiating from opposite side of body 586. The "C"-shaped metal bonding area 582*a* includes a single continuous top area 582*aa* and two end side areas 582*ab* which are perpendicularly disposed at opposite sides of the continuous area 582*aa*. The side areas 582*ab* are disposed on left and right sides respectively, but are not directly connected to continuous area 582*aa*. Instead, the side areas 582*ab* are discontinuous about the top left and right corners. The "J"-shaped metal bonding area 582*a* further includes a metal bonding area 584 that extends along the left side of body 586 below the left side area 582*ab*. Metal bonding area 556 has a source lead 582*b* coupled thereto. The "J"-shaped metal bonding area 582*a* is coupled to the top of die 580 via bond wires 588 which are distributed evenly about the top side and the top portion of the right and left sides.

The die 580 is disposed over leadframe pad 590 and has drain leads 590*b* radiating from the right side of body 586 to form the drain terminal 590. The drain leads 590*b* share the right side with leads 582*b* of the source terminal 582. The gate terminal 592 is disposed at the bottom left corner of package 570. The gate's bonding area is coupled to the die 580 via bond wire 554*a* and includes gate lead 592*b*. As can be readily seen, the number of drain leads 590*b* of the drain terminal 590 has been reduced however, the source terminals have been increased, such that there are source leads 582*b* on both sides of body 586.

The package 570 further includes electrical component 594 coupled to the top of die 580 via bond wires 598.

Figure 16:
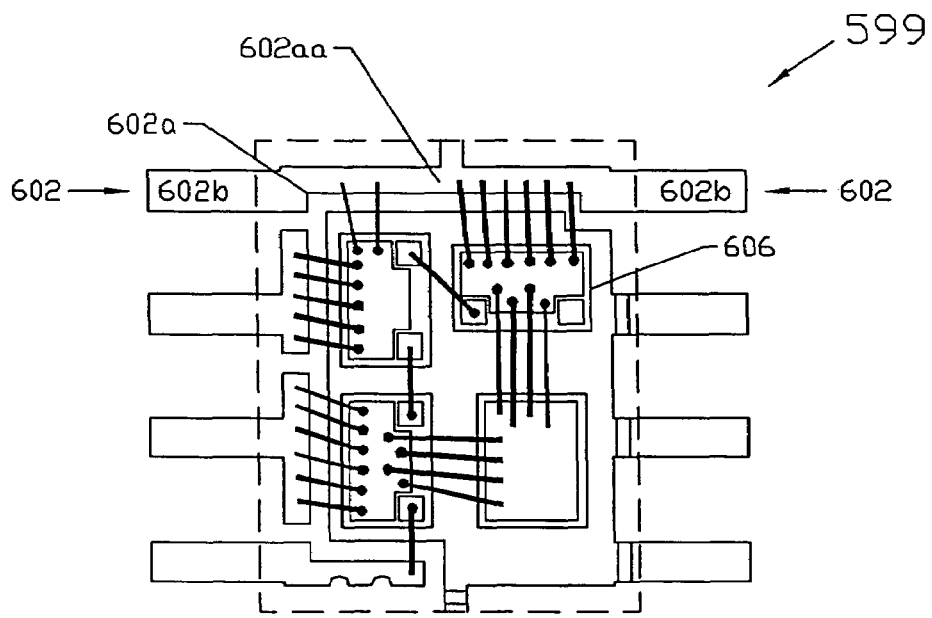
FIG. 16 illustrates a top view of the semiconductor package design with single pad for a multiple-die design in accordance with a thirteenth embodiment of present invention.

Referring now to FIG. 16, the package 599 is similar to the package 339 of FIG. 9. The embodiment of FIG. 16 differs in that the "L"-shaped metal bonding area 602a of the source terminal 602 has two diametrically opposing source leads 602b radiating from left and right side of the package 599. The source leads 602b extend from the first leg 602aa at opposite ends thereof.

Figure 17:
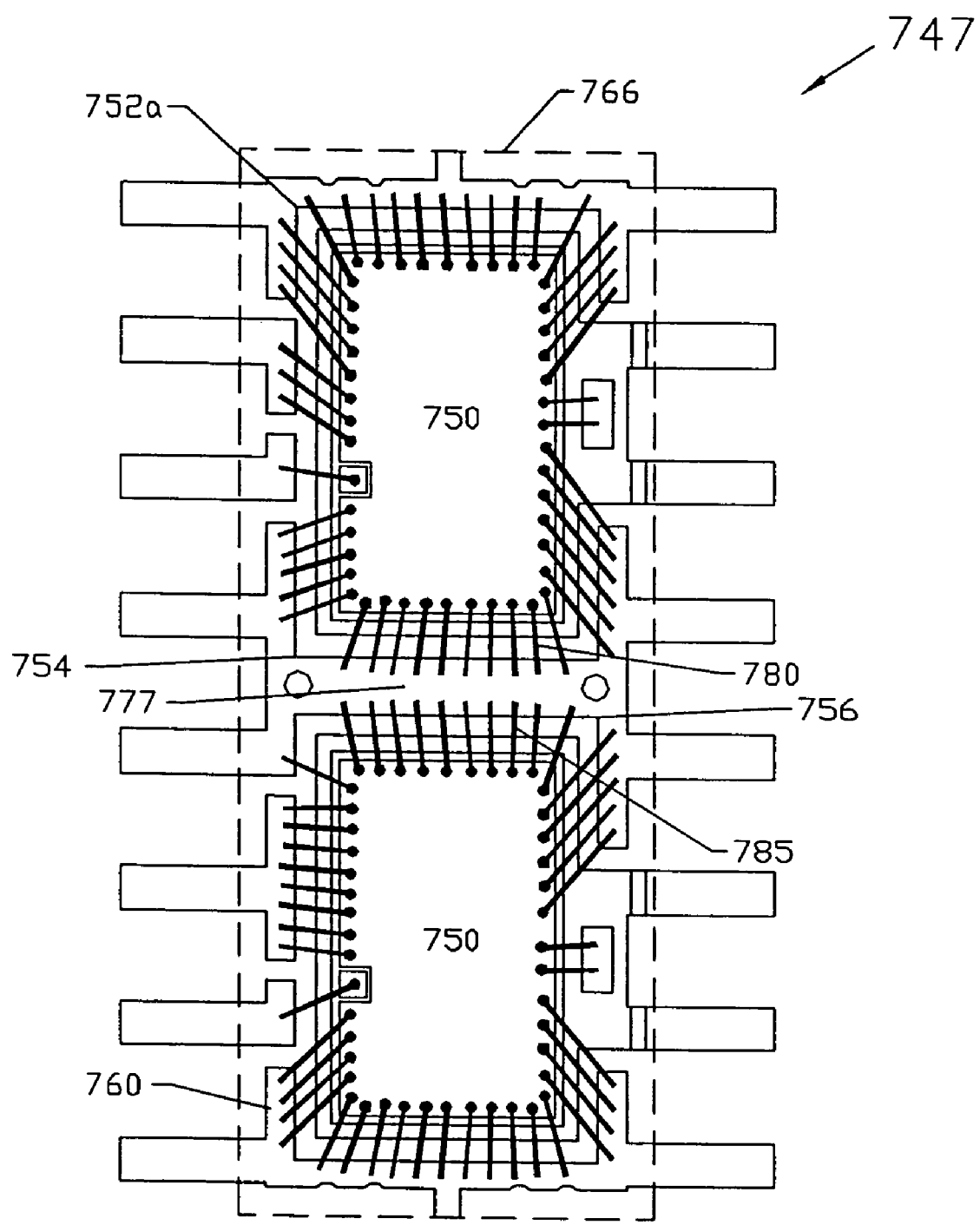
FIG. 17 illustrates a top view of the semiconductor package design with dual large pad for a multiple-die design in accordance with a fourteenth embodiment of present invention.

Referring now to FIG. 17, the package 747 is similar to FIG. 14 except that it is doubled. In this embodiment, the top die 750 has top "J"-shaped metal bonding area 752a and bottom "C"-shaped metal bonding areas 754. The bottom die 750 has a bottom "C"-shaped metal bonding area 760 and a top "C"-shaped metal boding area 756. The two "C"-shaped metal bonding areas 754 and 756, since they are in very close proximity to each other, are fused together to create a substantially center "I"-shaped metal bonding area 777. The center cross metal bonding area 777a bonds wires 780 and 785 to the top and bottom dice 750, respectively.

Figure 18:
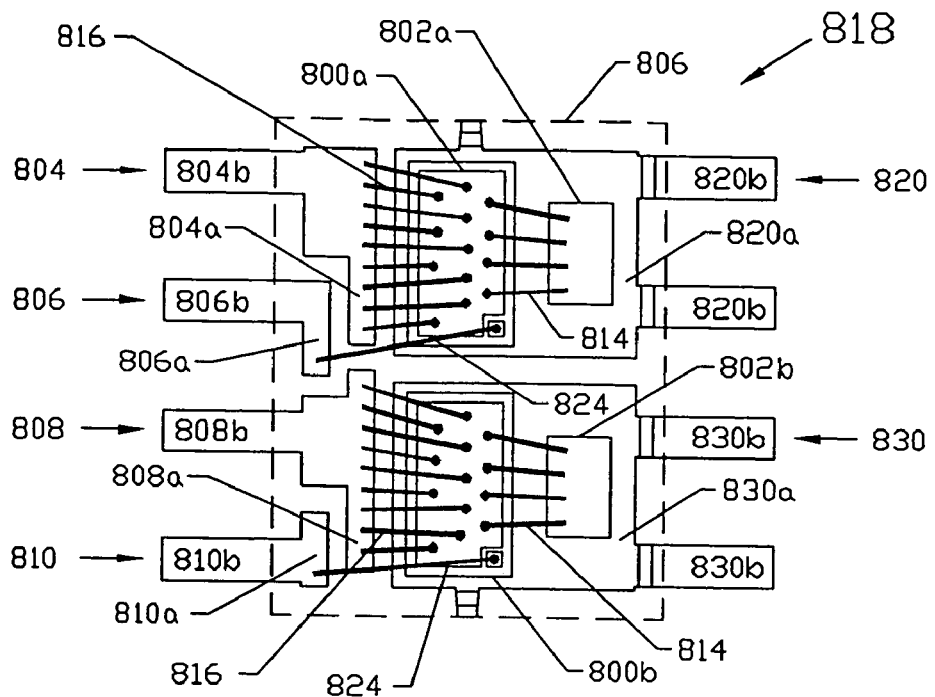
FIG. 18 illustrates a top view of the semiconductor package design with a multiple-die design in accordance with a fifteenth embodiment of present invention.

Referring now to FIG. 18, the package 818 includes two dice 800a and 800b and two electrical components 802a and 802b, respectively, such as, a semiconductor die, capacitor, resistor, etc. disposed on leadframe pad 820a and 830a. In this embodiment, the die of electrical components 802a and 802b is coupled to the top surfaces of dice 800a and 800b, respectively, via bond wires 814.

The source 804 of die 800a includes a lead 804b and meal bonding area 804a that extends substantially the length of die 800a. Likewise, he source 808 of die 800b includes a lead 808b and meal bonding area 808a that extends substantially the length of die 800b.

The gate terminal 806 of die 800a has a gate's lead 806b in parallel with the source's lead 804b. The gate's metal bonding area 806a is parallel with a portion of metal bonding area 804a. The gate's metal bonding area 806a is coupled to a gate pad via bond wire 824. In the exemplary embodiment, the gate pad is substantially coupled in the lower right corner of die 800a. Similarly, the gate terminal 810 of die 800b has a gate's lead 810b in parallel with the source's lead 808b. The gate's metal bonding area 810a is parallel with a portion of metal bonding area 808a. The gate's metal bonding area 810a is coupled to a gate pad in the lower right corner of die 800a, via bond wire 824.

Figure 19:
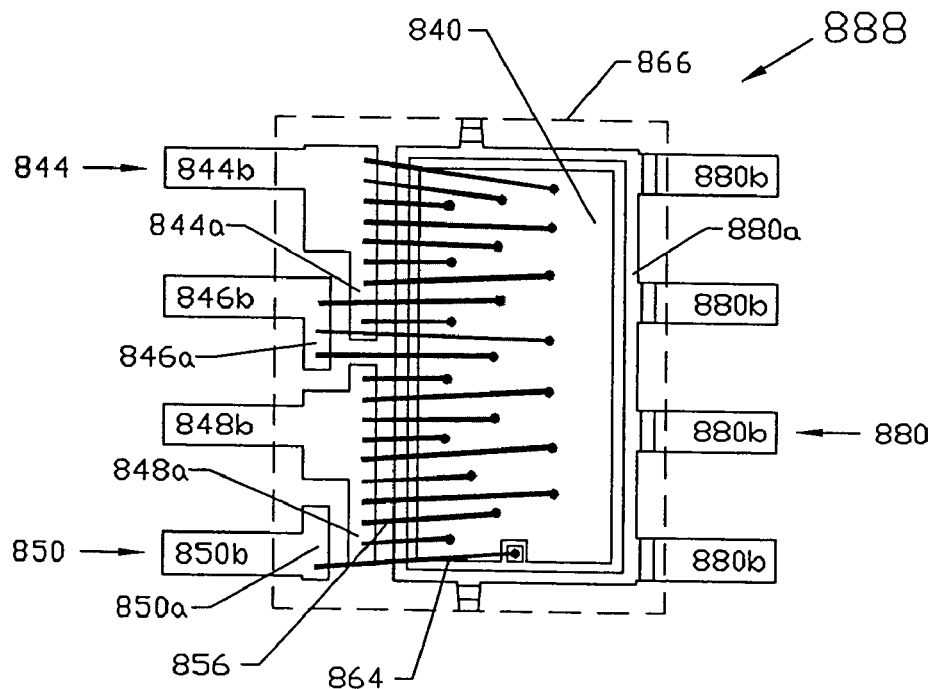
FIG. 19 illustrates a top view of the semiconductor package design with a single die design in accordance with a sixteenth embodiment of present invention.

Referring now to FIG. 19, a top view of the semiconductor package 888 with a single die design in accordance with a sixteenth embodiment of present invention is illustrated. Package 888 differs from previous embodiments in that the source terminal 844 includes multiple leads 844b, 846b and 848b coupled to the sources' metal bonding areas 844a, 846a and 848a, respectively. Metal bonding area 844a and 848a substantially extend along the length of die 870 and are coupled to the top of die 870 via bonding wires 856. Source lead 846b is positioned between leads 844b and 848b. However, metal bonding area 846a is parallel to portions of at least one of the metal bonding area 844a and 848a. Likewise, metal bonding area 846a is coupled to the top of die 870 via bonding wires 856.

The size of the die 870 is reduced along the source side within the plastic body 866. Accordingly, the source's overall metal bonding area (areas 844a, 846a, 848a) is increased in size.

The gate terminal 850 has a gate's lead 850b in parallel with the source's leads 844b, 846b and 848b. The gate's metal bonding area 850a is parallel with a portion of metal bonding area 848a. The gate's metal bonding area 850a is coupled to a gate pad via bond wire 864. In the exemplary embodiment, the gate pad is substantially coupled in the middle of a bottom side of die 870.

The drain terminal 880 includes a plurality of drain leads 880b coupled to the leadframe pad 880a.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications, which come within the scope of the appended claims, is reserved.

What is claimed is:

1. A semiconductor integrated circuit package comprising:
    a die having an integrated circuit; and
    a leadframe having a leadfrarme pad of reduced size about a corner thereof disposed under the die and a banding metal area formed at the corner having a first section distributed along a substantial portion of a length of a first side of the corner and a second section distributed along a substantial portion of a length of a second side of the corner.

2. The package according to claim 1, wherein the second section is distributed along the substantial portion or the length of the second side of the corner in discontinuous sections.

* * * * *